(12) United States Patent
Pav et al.

(10) Patent No.: US 10,939,578 B2
(45) Date of Patent: Mar. 2, 2021

(54) FAN TRAY SYSTEM

(71) Applicant: Dell Products L.P., Round Rock, TX (US)

(72) Inventors: Darren Burke Pav, Round Rock, TX (US); Jake Hill Lavallo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 225 days.

(21) Appl. No.: 15/691,346

(22) Filed: Aug. 30, 2017

(65) Prior Publication Data

US 2019/0069442 A1 Feb. 28, 2019

(51) Int. Cl.
*H05K 7/20* (2006.01)
*H05K 5/02* (2006.01)
*H05K 7/14* (2006.01)
*G06F 1/20* (2006.01)

(52) U.S. Cl.
CPC ........... *H05K 7/20172* (2013.01); *G06F 1/20* (2013.01); *H05K 5/0247* (2013.01); *H05K 7/14* (2013.01); *H05K 7/20145* (2013.01); *H05K 7/20727* (2013.01)

(58) Field of Classification Search
CPC .. H05K 7/14; H05K 7/20145; H05K 7/20172; H05K 7/20581; H05K 7/20727; H05K 5/0247; G06F 1/20
USPC .................................................. 361/679.49
See application file for complete search history.

(56) References Cited

U.S. PATENT DOCUMENTS

| | | | |
|---|---|---|---|
| 4,862,659 A | 9/1989 | Wilson et al. | |
| 6,089,899 A * | 7/2000 | Wang | H01R 12/7047 439/377 |
| 6,805,623 B2 * | 10/2004 | Robison | B60H 1/00478 454/143 |
| 2011/0228476 A1 * | 9/2011 | Lin | G06F 1/185 361/695 |
| 2012/0026678 A1 * | 2/2012 | Rodriguez | G06F 1/20 361/679.48 |
| 2012/0148397 A1 * | 6/2012 | Tsai | F03D 80/00 415/213.1 |
| 2016/0073521 A1 | 3/2016 | Marcade et al. | |

* cited by examiner

*Primary Examiner* — Anatoly Vortman
*Assistant Examiner* — Zhengfu J Feng
(74) *Attorney, Agent, or Firm* — Haynes and Boone, LLP

(57) ABSTRACT

A fan tray system includes a fan tray base that couples to a chassis and that includes fan system connector(s) for connecting to a fan system. A fan tray side wall includes fan system guide member(s) that align the fan system for connection to the fan system connector(s), and is connected to the fan tray base by a moveable coupling that allows relative movement between the fan tray side wall and the fan tray base. That relative movement allows the fan tray side wall to be positioned in a first orientation when the fan tray base is coupled to the chassis such that the fan tray side wall is positioned adjacent a chassis wall of the chassis and impedes access component(s) in the chassis. That relative movement also allows the fan tray side wall to be moved to a second orientation that allows access to the component(s) in the chassis.

20 Claims, 11 Drawing Sheets

FAN TRAY SYSTEM

BACKGROUND

The present disclosure relates generally to information handling systems, and more particularly to a fan tray system used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems such as, for example, servers, continue to increase in computing power, the density of components within the server chassis increases as well. As such, server manufacturers are faced with the challenge of maximizing server feature sets in a limited amount of available server chassis space. For example, it is desirable to provide for tool-less installation and removal of components in the server chassis, as well as to minimize the steps needed to access those components in the server chassis. Furthermore, cable routing within the server chassis is always a challenge with regard to finding paths in the server chassis to route cabling, routing that cabling without impacting airflow, and accessing that cabling once it is routed. Conventional fan trays are provided in server chassis to allow for fan systems to be coupled to the server chassis, but fail to achieve many of the goals for dense server chassis discussed above.

Accordingly, it would be desirable to provide an improved fan tray system.

SUMMARY

According to one embodiment, an Information Handling System (IHS) includes a chassis that includes a chassis wall; a cable routed immediately adjacent the chassis wall; a fan tray base that is coupled to the chassis; at least one fan system connector that is coupled to the fan tray base and that is configured to connect to a fan system including at least one fan device; a fan tray side wall including at least one fan system guide member that is configured to align the fan system for connection to the at least one fan system connector; and a moveable coupling connecting the fan tray side wall to the fan tray base, wherein the moveable coupling is configured to allow relative movement between the fan tray side wall and the fan tray base such that: the fan tray side wall may be positioned in a first orientation such that the fan tray side wall is positioned adjacent the chassis wall and impedes access to the cable; and the fan tray side wall may be moved to a second orientation that is different than the first orientation and that allows access to the cable.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
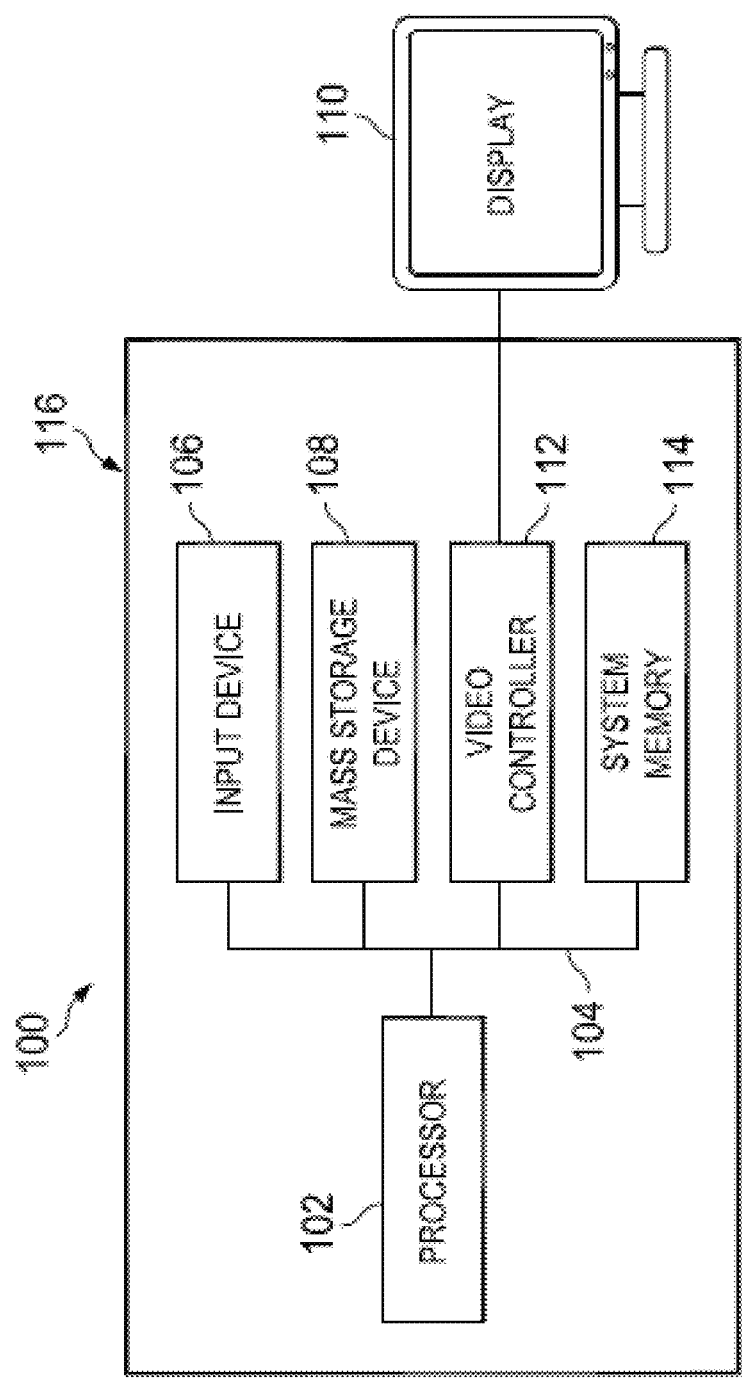
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
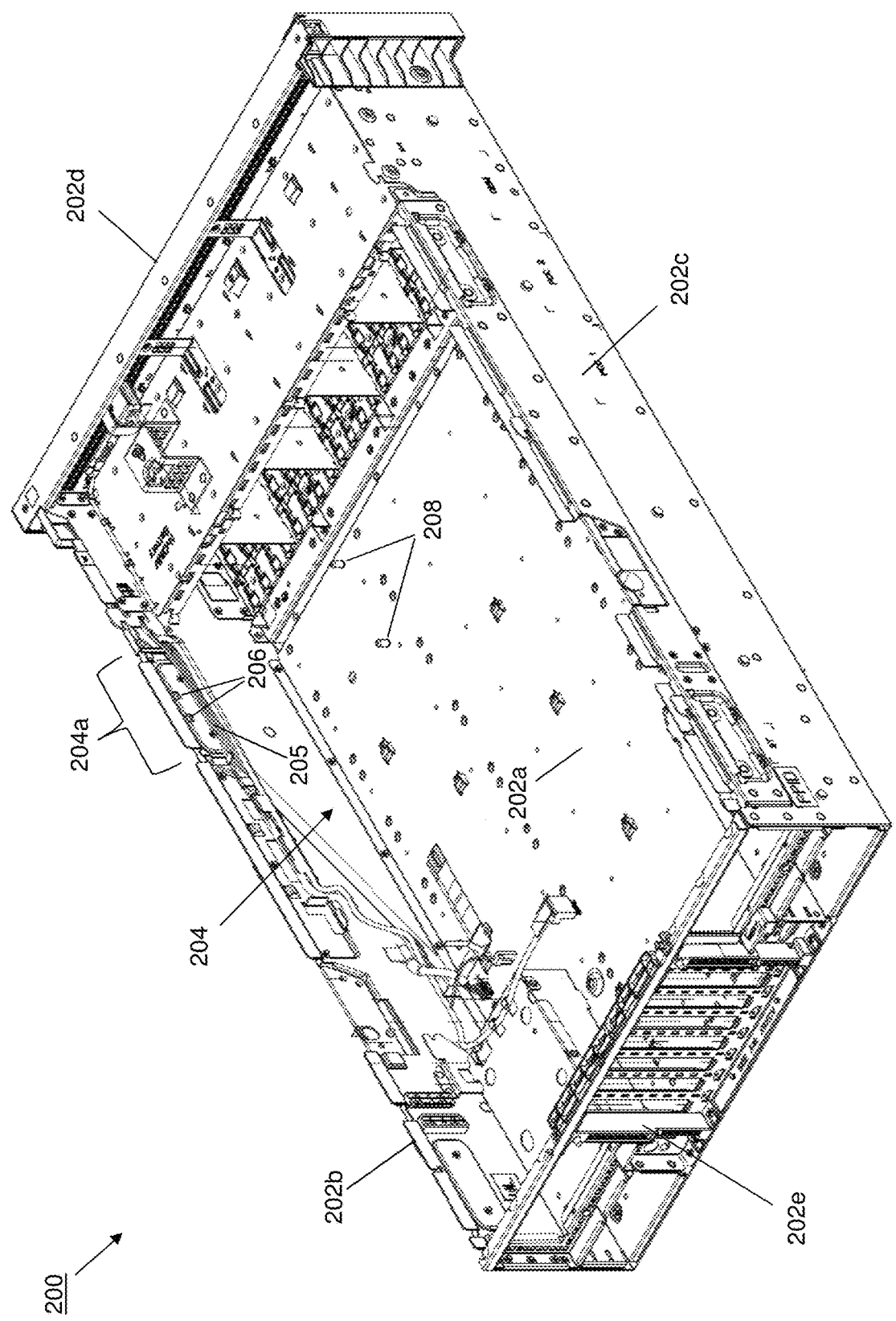
FIG. 2 is a perspective view illustrating an embodiment of a chassis.

Referring now to FIG. 2, an embodiment of a chassis 200 is illustrated. In an embodiment, the chassis 200 may be the chassis 116 discussed above with reference to FIG. 1. While one of skill in the art in possession of the present disclosure will recognize the chassis 200 as a server chassis, other types of chassis may benefit from the teachings of the present disclosure and thus are envisioned as falling within its scope as well. In the illustrated embodiment, the chassis includes a bottom wall 202*a*, a pair of substantially parallel side walls 202*b* and 202*c* that extend substantially perpendicularly from opposite edges of the bottom wall 202*a*, a front wall 202*d* that extends substantially perpendicularly from an edge of the bottom wall 202*a* and between the side walls 202*b* and 202*c*, and a rear wall 202*e* that extends opposite the bottom wall 202*a* from the front wall 202*d* and substantially perpendicularly from an edge of the bottom wall 202*a* and between the side walls 202*b* and 202*c*. While not illustrated, one of skill in the art in possession of the present disclosure will recognize that the chassis 200 may include a top wall that is configured to couple to the edges of the side walls 202*b* and 202*d*, the front wall 202*d*, and the rear wall 202*e* such that it is positioned opposite those walls from the bottom wall 202*a*. The bottom wall 202*a*, the side walls 202*b* and 202*d*, the front wall 202*d*, and the rear wall 202*e* define a chassis housing 204 that is located between them and configured to house components such as, for example, the IHS components of the IHS 100 discussed above with reference to FIG. 1.

As discussed in detail below, a portion of the chassis housing 204 is provided as a fan tray system housing 204*a*. In the illustrated embodiment, a cable 205 is illustrated as being routed along the side wall 202*b* adjacent the fan tray system housing 204*a*, but one of skill in the art in possession of the present disclosure will recognize that other cabling, and/or other components may be located adjacent to the fan tray system housing 204*a* while remaining within the scope of the present disclosure. Furthermore, while not discussed in detail below, one of skill in the art in possession of the present disclosure will recognize that the remainder of the chassis housing may be configured to house boards (e.g., motherboards), processing systems (e.g., the processor 102 discussed above with reference to FIG. 1), memory systems (e.g., the system memory 114 discussed above with reference to FIG. 1), storage systems (e.g., the storage device 108 discussed above with reference to FIG. 1), communications subsystems, and/or a variety of other chassis components known in the art. In the illustrated embodiment, the side wall 202*b* of the chassis 200 includes a fan tray securing feature 206 that is located adjacent the fan tray system housing 204*a* and, while not explicitly illustrated, as discussed below the side wall 202*c* of the chassis 200 may include a similar fan tray securing feature as well. In the illustrated embodiment, a keying system 208 is provided on the bottom wall 202*a* of the chassis 200 by pegs that extend from the bottom wall 202*a* and into the fan tray system housing 204*a*. While only two pegs in the keying system 208 are illustrated, as discussed below, two additional pegs (e.g., obscured by the side wall 202*c* in FIG. 2) may be provided on the chassis 200. Furthermore, one of skill in the art in possession of the present disclosure will recognize that a variety of other types of keying features may be utilized to provide the functionality of the keying system 208 discussed below. While a specific chassis 200 has been illustrated and described, one of skill in the art in possession of the present disclosure will recognize that a wide variety of chassis having a variety of different features will benefit from the teachings of the present disclosure and thus fall within its scope as well.

Figure 3:
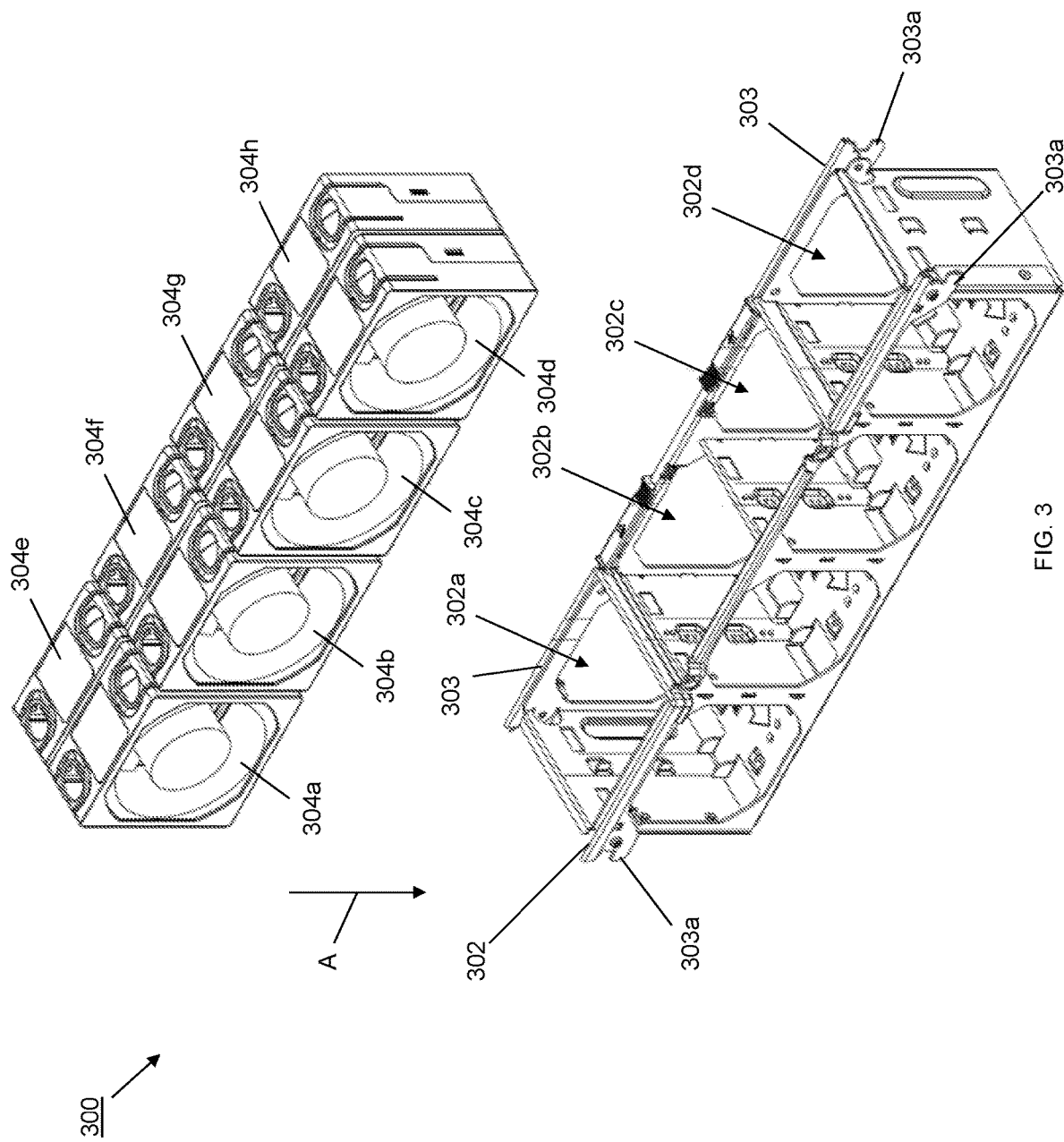
FIG. 3 is a perspective view illustrating an embodiment of a fan system.

Referring now to FIG. 3, an embodiment of a fan system 300 is illustrated. In the illustrated embodiment, the fan system 300 includes a fan device chassis 302 that defines a plurality of fan device housings 302*a*, 302*b*, 302*c*, and 302*d*. In the illustrated embodiment, the fan device chassis 302 includes securing handles 303 that are rotatably coupled to opposite sides of the fan device chassis 302 and configured to provide for both of the supporting of the fan device chassis 302, and the securing of the fan device chassis in the fan tray system discussed below (e.g., via cam elements 303*a* on the securing handles 303.) The fan system also includes a plurality of fan devices 304*a*, 304*b*, 304*c*, 304*d*, 304*e*, 304*f*, 304*g*, and 304*h*, pairs of which are configured to be housed in the fan device housings 302*a-d* defined by the fan device chassis 302 (i.e., when moved in the direction A illustrated in FIG. 3.) While not discussed in detail, one of skill in the art in possession of the present disclosure will recognize that the fan device chassis 302 and/or the fan devices 304*a-h* may include securing members for securing the fan devices 304*a-d* in the fan device housings 302*a-d*, that the fan devices 304*a-h* may include connectors (not illustrated) that are configured to be accessed through the fan device chassis 302 when the fan devices 304*a-h* are positioned in the fan device housings 302*a-d*, that the fan device chassis 302 may include keying features for ensuring proper orientation of the fan devices 304*a-h* in the fan device chassis 302*a-d*, and/or that the fan system 300 may include a variety of other fan system features known in the art.

Referring now to FIGS. 4A, 4B, 4C, 4D, and 4E, an embodiment of a fan tray system 400 is illustrated. The fan tray system 400 includes a fan tray base 402 having a front edge 402*a*, a rear edge 402*b* that is located opposite the fan tray base 402 from the front edge 402*a*, and a pair of opposing side edges 402*c* and 402*d* that extend between the front edge 402*a* and the rear edge 402*b*. In addition, the fan tray base 402 defines a plurality of keying elements 402*e* that, in the illustrated embodiment, are provided by spaced apart apertures that are defined by the fan tray base 402 and that extend through the fan tray base 402. In the illustrated embodiment, the side edge 402*a* of the fan tray base 402 defines a plurality of cable apertures 403 that are configured to allow the routing of cables (e.g., system cables, discussed below) past the fan tray base 402. As discussed below, cable apertures plugs 403*a* may be provided to block airflow through cable apertures 403 that are not being used to route cables. Furthermore, groups of fan device connectors 404 are coupled to respective system connectors 406 by cabling, and are mounted to the fan tray base 402 via connector mounts 408 that allow the fan device connectors 404 to extend from the fan tray base 402. While not explicitly described in detail, one of skill in the art in possession of the present disclosure will recognize how the fan tray base 402 includes features for securing the connectors 404 and 406 and routing the cabling between those connectors 404 and 406, only some of which are illustrated in FIGS. 4A-4E. For example, the fan tray system 400 of the illustrated embodiment includes cable routing members 410, a subset of which are configured to gather, clip, or otherwise provide for the routing of cables connecting the fan device connectors 404 and the system connectors 406 through the fan tray system 400 in an organized manner, although the use of the cable routing members 410 for other cabling subsystems (e.g., cabling extending through the housing 204 of the chassis 200) will fall within the scope of the present disclosure as well.

The fan tray system 400 also includes fan tray side wall(s) that are moveably coupled to the fan tray base 402. In the illustrated embodiment, a fan tray side wall 412 is rotatably coupled to the fan tray base 402 adjacent the side edge 402c, and a fan tray side wall 414 is rotatably coupled to the fan tray base 402 adjacent the side edge 402d. For example, the fan tray side wall 412 includes a base portion 412a having a pair of fan system guides 412b that extend from opposite edges of the base portion 412a and that each include a rotatable coupling member 412c to provide the rotatable coupling members 412c adjacent an edge of, and on opposite sides of, the base portion 412a. As can be seen, the pair of rotatable coupling members 412c are configured to couple to rotatable coupling features 416 that are provided adjacent the side edge 402d on the fan tray base 402. The fan tray side wall 412 also defines a handling element 412d that, in the illustrated embodiment, is provided by a finger hole that is centrally located on the fan tray side wall 412. A fan tray securing subsystem is included on the fan tray side wall 412 and, in the illustrated embodiment, is provided by a securing element 412e that is coupled to a securing edge 412f on the fan tray side wall 412 by a securing housing 412g. An airflow directing member 412h is coupled to the surface of the fan tray side wall 412 that is opposite the fan tray side wall 412 from the fan tray base 412.

Similarly, the fan tray side wall 414 includes a base portion 414a having a pair of fan system guides 414b that extend from opposite edges of the base portion 414a and that each include a rotatable coupling member 414c to provide the rotatable coupling members 414c adjacent an edge of, and on opposite sides of, the base portion 414a. As can be seen, the pair of rotatable coupling members 414c are configured to couple to rotatable coupling features 418 that are provided adjacent the side edge 402c on the fan tray base 402. The fan tray side wall 414 also defines a handling element 414d that, in the illustrated embodiment, is provided by a finger hole that is centrally located on the fan tray side wall 414. A fan tray securing subsystem is included on the fan tray side wall 414 and, in the illustrated embodiment, is provided by a securing element 414e that is coupled to a securing edge 414f on the fan tray side wall 414 by a securing housing 414g. An airflow directing member 414h is coupled to the surface of the fan tray side wall 414 that is opposite the fan tray side wall 414 from the majority of the fan tray base 414.

Figure 4A:
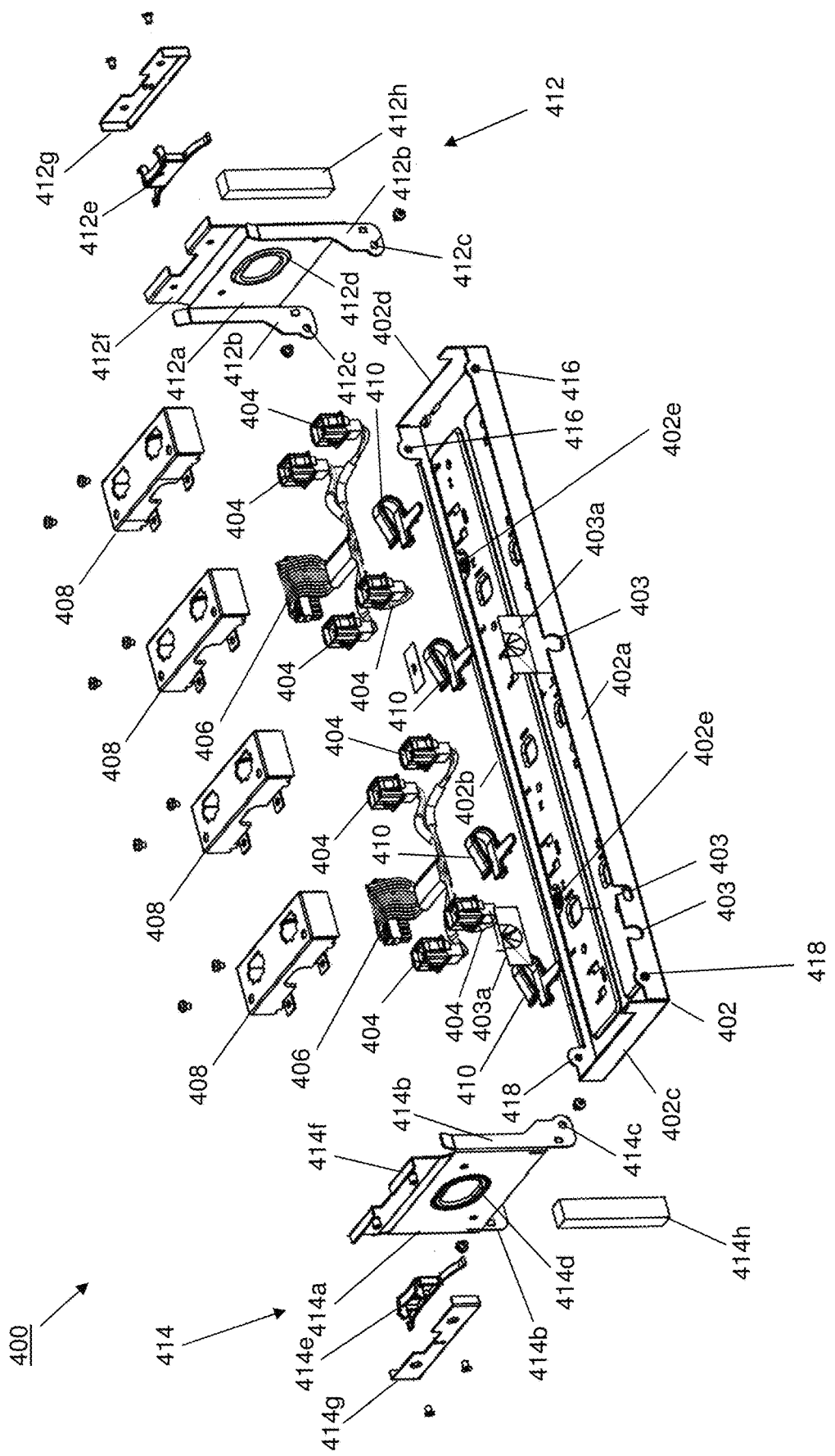
FIG. 4A is an exploded perspective view illustrating an embodiment of a fan tray system.
Figure 4B:
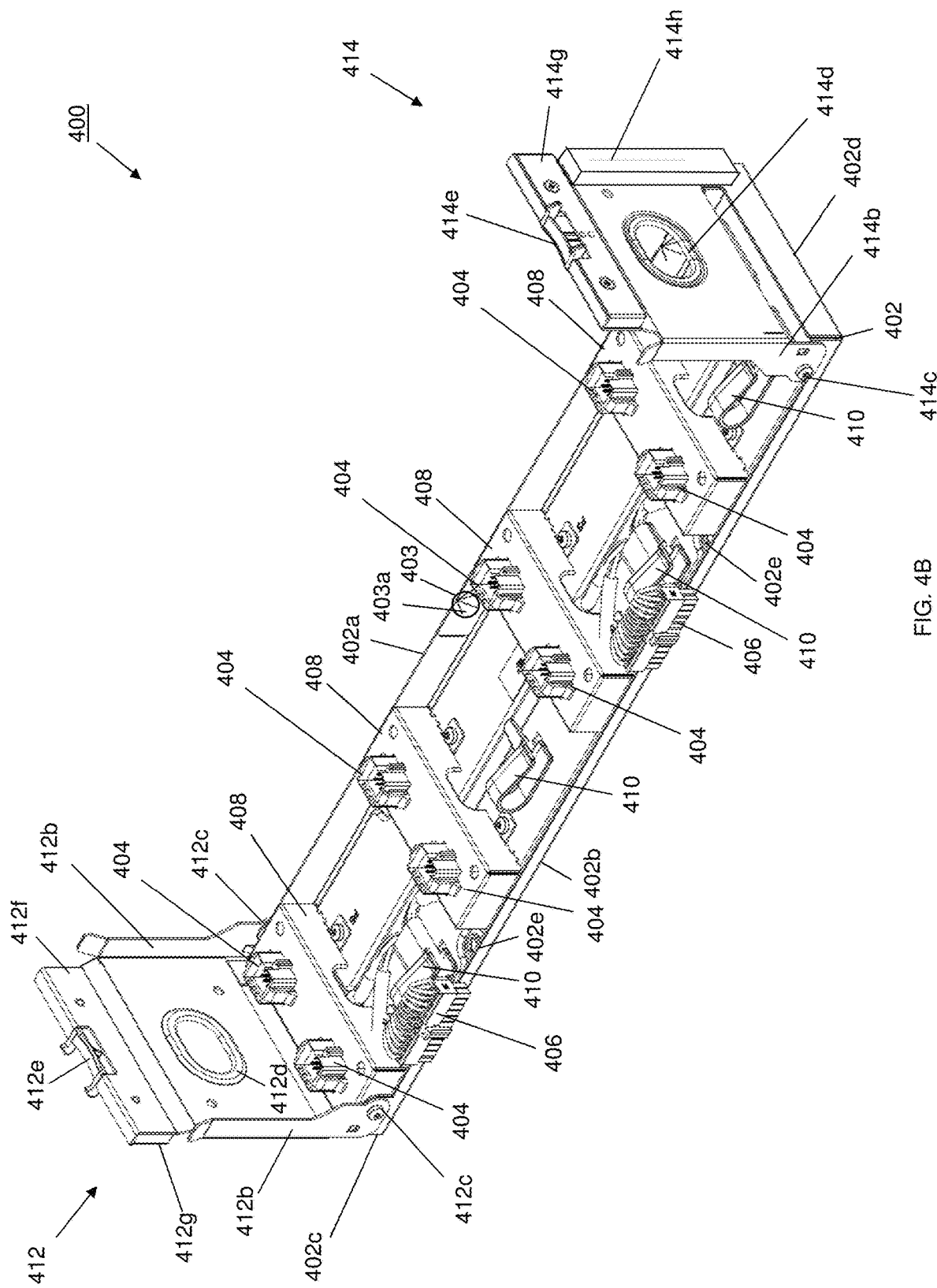
FIG. 4B is an assembled perspective view illustrating an embodiment of the fan tray system of FIG. 4A.
Figure 4C:
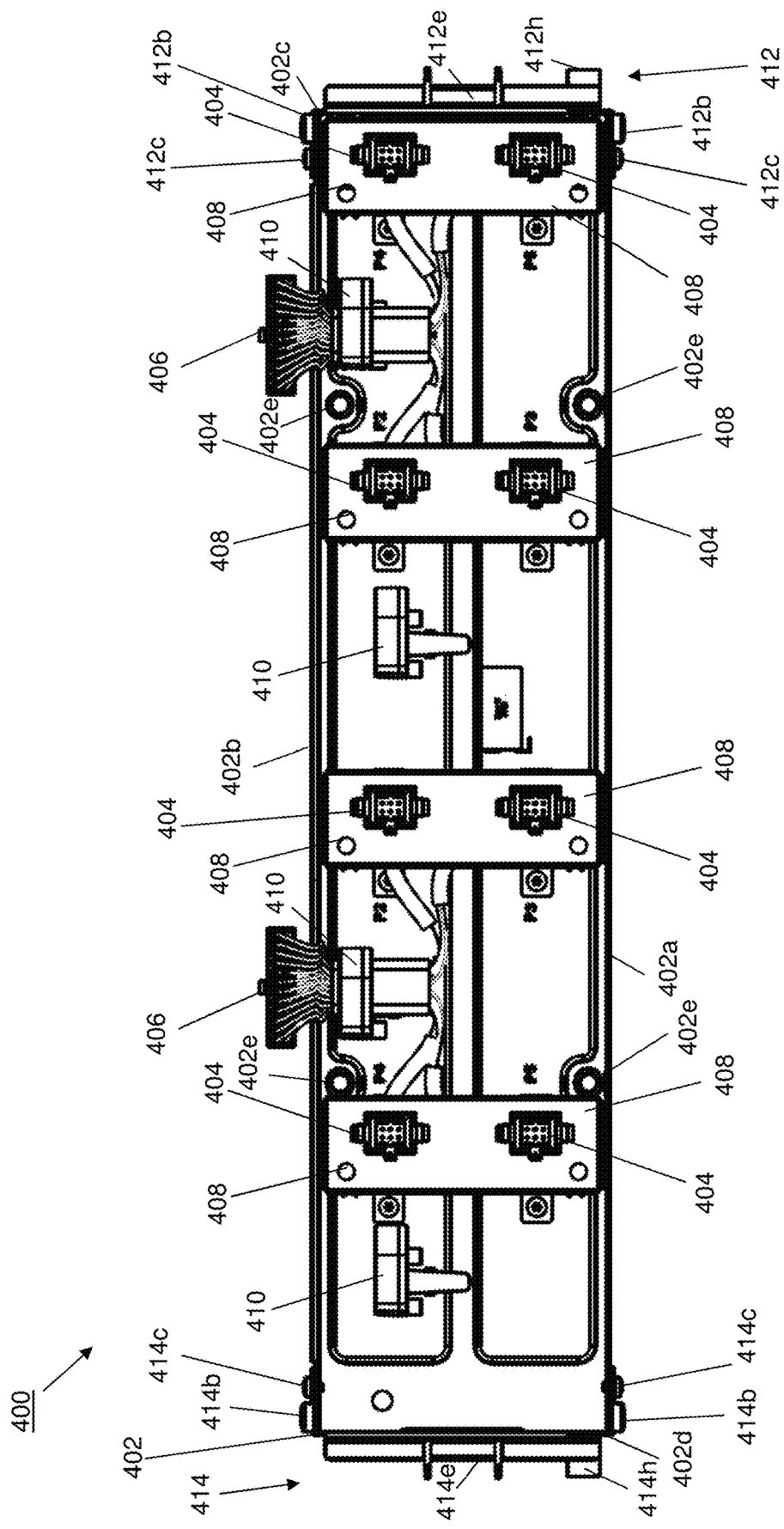
FIG. 4C is a top view illustrating an embodiment of the fan tray system of FIG. 4B.
Figure 4D:
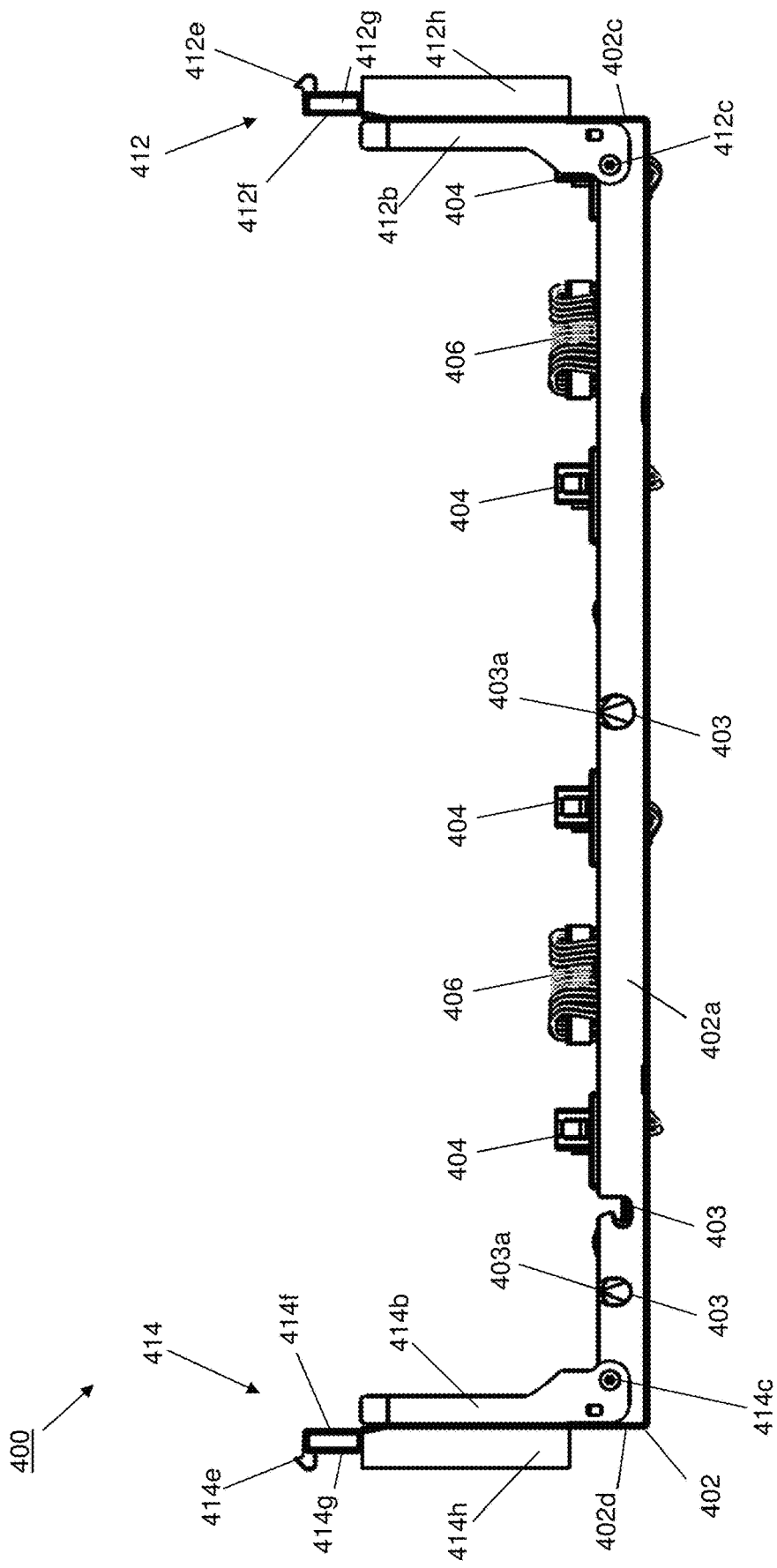
FIG. 4D is a side view illustrating an embodiment of the fan tray system of FIG. 4B with the fan tray side walls in a first orientation.
Figure 4E:
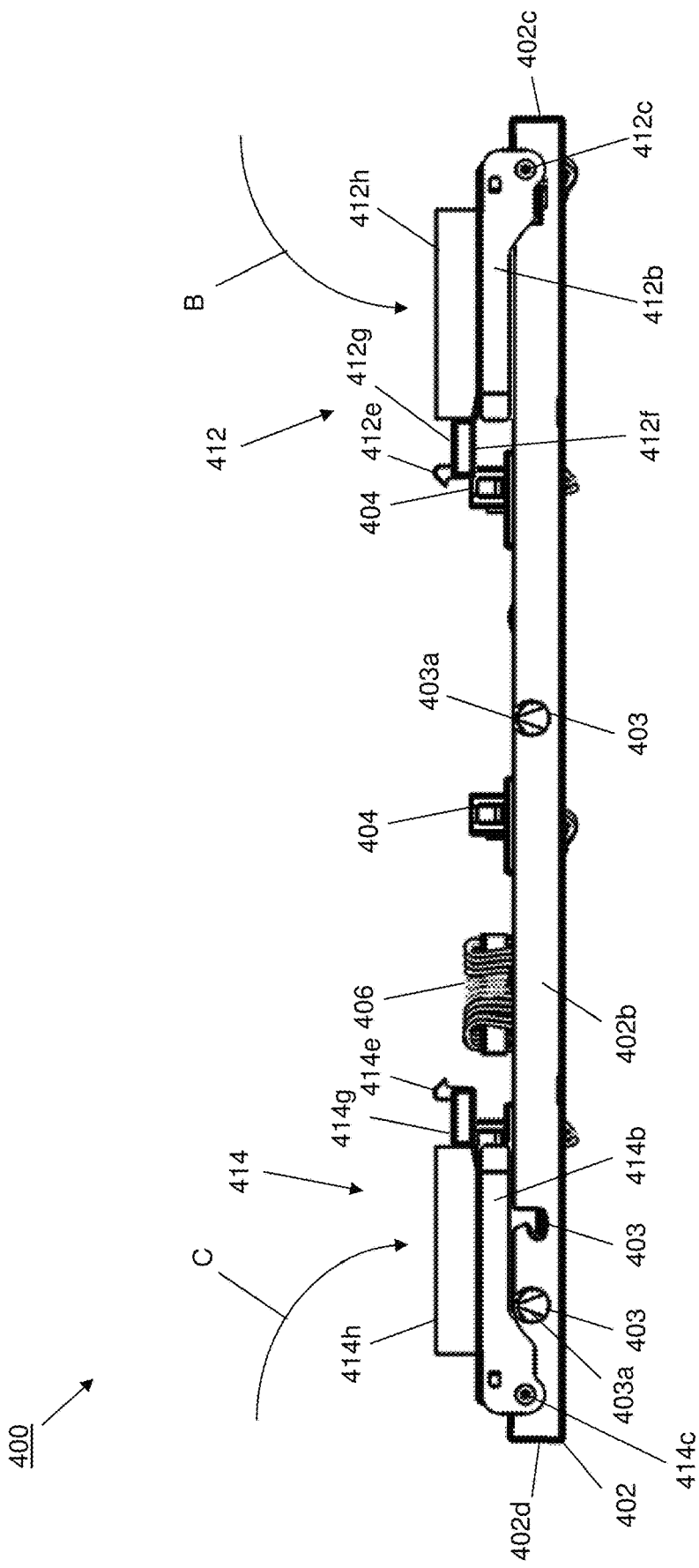
FIG. 4E is a side view illustrating an embodiment of the fan tray system of FIG. 4B with the fan tray side walls in a second orientation.

As illustrated in FIGS. 4A, 4D, and 4E, the coupling of the rotatable coupling members 412c on the fan tray side wall 412 to the rotatable coupling features 416 on the fan tray base 402 provide for rotation of the fan tray side wall 412 relative to the fan tray base 402 in a direction B from a first orientation in which the fan tray side wall 412 is substantially perpendicular to the fan tray base 402 (illustrated in FIG. 4D), to a second orientation in which the fan tray side wall 412 is substantially parallel to the fan tray base 402 (illustrated in FIG. 4E.) Similarly, the coupling of the rotatable coupling members 414c on the fan tray side wall 414 to the rotatable coupling features 418 on the fan tray base 402 provide for rotation of the fan tray side wall 414 relative to the fan tray base 402 in a direction C from a first orientation in which the fan tray side wall 414 is substantially perpendicular to the fan tray base 402 (illustrated in FIG. 4D), to a second orientation in which the fan tray side wall 414 is substantially parallel to the fan tray base 402 (illustrated in FIG. 4E.) However, while a specific fan tray system has been illustrated and described, one of skill in the art in possession of the present disclosure will recognize that fan tray systems may include different numbers of components, other types of components, different configurations of components, and/or perform the functionality described herein in a different manner while remaining within the scope of the present disclosure. For example, rather than the rotatable movement enabled by the structures described herein, the fan tray side walls 412 and 414 may translate or perform other types of movement while remaining within the scope of the present disclosure.

Figure 5:
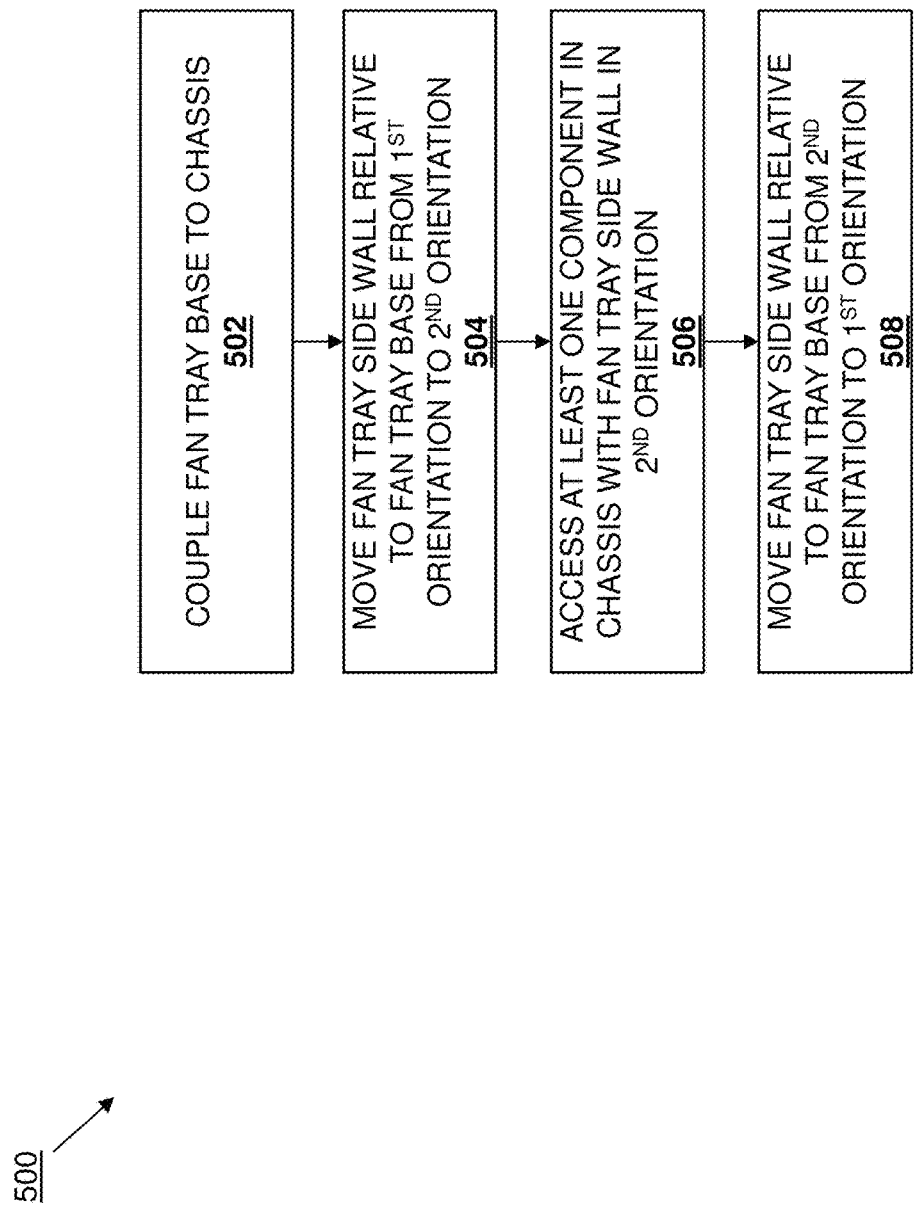
FIG. 5 is a flow chart illustrating an embodiment of a method for providing a fan tray system in a server chassis.

Referring now to FIG. 5, an embodiment of a method 500 for providing a fan tray system in a chassis is illustrated. As discussed below, the system and methods for the present disclosure provide a fan tray system that is configured to couple to a chassis without the use of a tool, along with fan tray side walls that may be moved relative to the chassis (when the fan tray system is coupled to that chassis) between a first orientation and a second orientation to allow access to portions of, or components in, the chassis that may be impeded when the fan tray side walls are in the first orientation. Furthermore, the fan tray side walls provide for the guiding of a fan system into the fan tray system to connect to fan device connectors. Further still, the fan tray side wall may include airflow directing members that engage the chassis when the fan tray side walls are in the first orientation, and that operate to direct air through the fan devices in the fan system. As such, one of skill in the art in possession of the present disclosure will recognize that the fan tray system described herein introduces a variety of improvements over conventional fan tray systems known in the art.

Figure 6A:
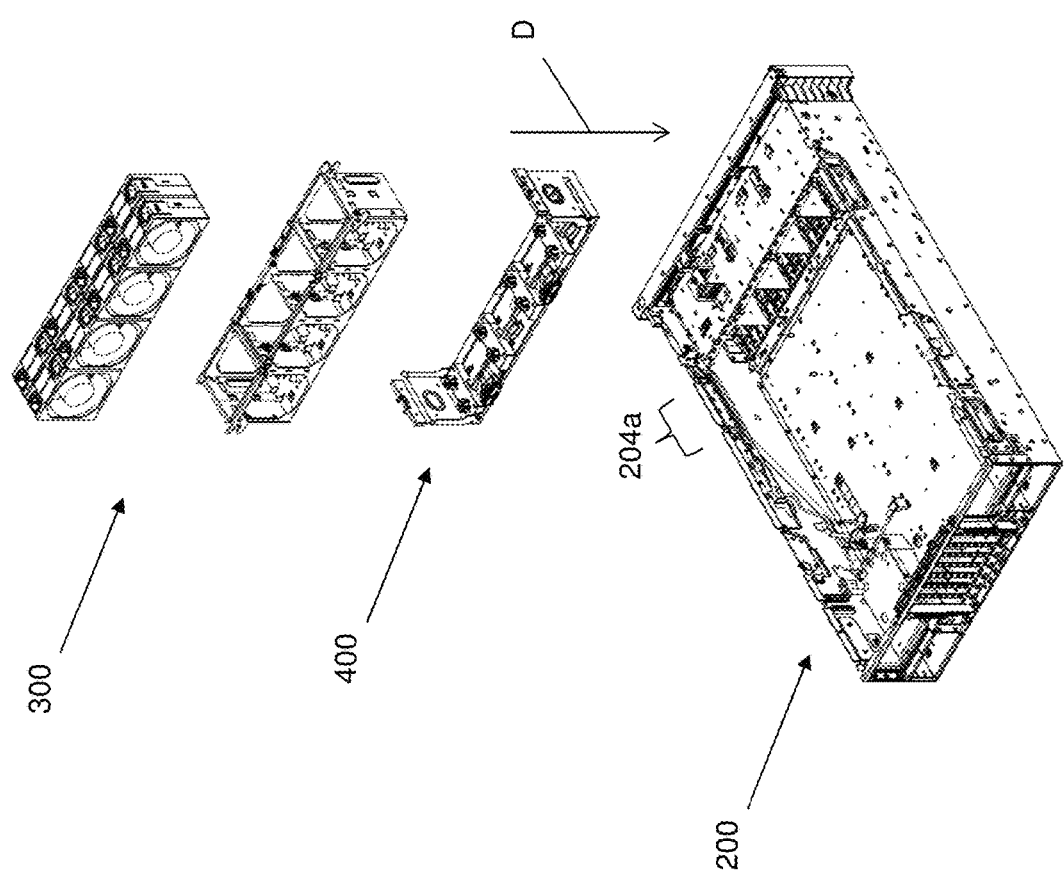
FIG. 6A is a perspective view illustrating an embodiment of the fan system of FIG. 3 and the fan tray system of FIGS. 4B-4E being positioned in the chassis of FIG. 2.
Figure 6B:
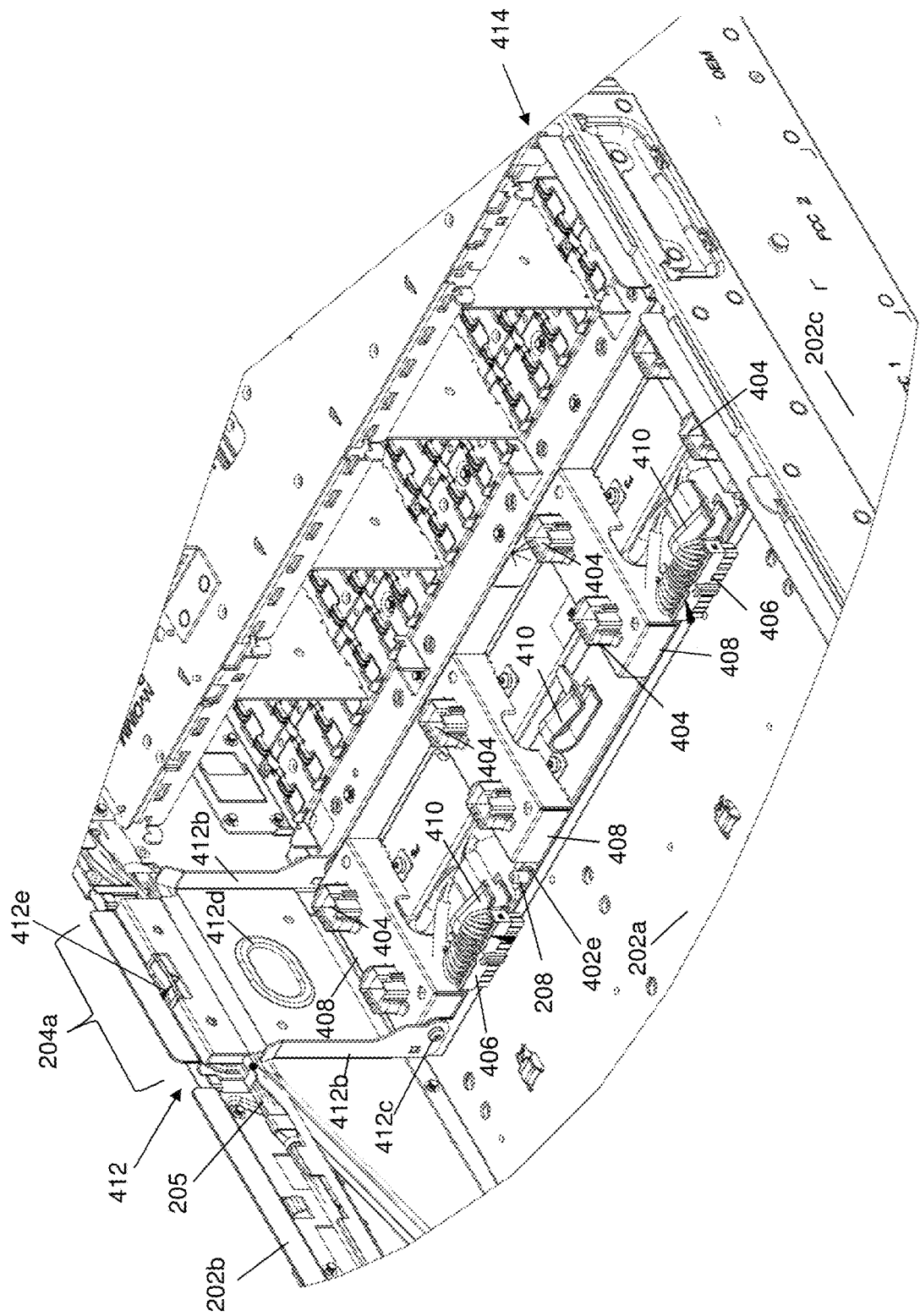
FIG. 6B is a perspective view illustrating the fan tray system of FIGS. 4B-4E secured in the server chassis of FIG. 2.

The method 500 begins at block 502 where a fan tray base is coupled to a chassis. In an embodiment, at block 502, the fan tray system 400 may be positioned adjacent the chassis 200 (e.g., by a user utilizing the handling elements 412d/414d (finger holes in the illustrated embodiment) to hold the fan tray system 400) such that the fan tray base 402 is located above the chassis 200 and adjacent the fan tray system housing 204a defined by the chassis 200, as illustrated in FIG. 6A. In the embodiment illustrated in FIG. 6A, the fan tray side walls 412 and 414 are illustrate as being positioned in the first orientation of FIG. 4D when the fan tray system 400 is being positioned in the fan tray system housing 204a, but one of skill in the art in possession of the present disclosure will recognize that the fan tray side walls 412 and 414 may be positioned in the second orientation of FIG. 4E when the fan tray system 400 is being positioned in the fan tray system housing 204a while remaining within the scope of the present disclosure as well. The fan tray system 400 may then be moved in a direction D such that the fan tray system enters the fan tray system housing 204a defined by the chassis 200, and continued movement of the fan tray system 400 in the direction D will cause the keying system 208 (e.g., the pegs in this embodiment) on the chassis 200 to engage the keying elements 402e (e.g., the apertures in this embodiment) on the fan tray base 402 in order to allow for proper orientation of the fan tray system 400 in the chassis 200, as illustrated in FIG. 6B. One of skill in the art in possession of the present disclosure will recognize that the keying system 208 and the keying elements 402e may be configured to ensure that the fan tray system 400 may only be coupled to the chassis 200 in a single orientation (e.g., such that fan devices in a fan system 300 coupled to the fan tray system 400 will direct air in a desired direction.) With the fan tray system 400 positioned in the chassis 200, the system connectors 406 may be coupled to a system component in the chassis 200 (e.g., a fan system connector on a motherboard, not illustrated.) While not described in detail below, one of skill in the art in possession of the present disclosure will recognize that removal of the fan tray system 400 from the chassis 200 may be performed in substantially the reverse of that described above (e.g., disconnecting the system connectors 406 from the system component in the chassis 200, and using the handling elements 412d/414d (finger holes in the illustrated embodiment) to lift the fan tray system 400 out of the chassis 200.)

As can be seed in FIG. 6B, with the fan tray system 400 positioned in the chassis 200 and the fan tray side wall 412 in the first orientation, the fan tray side wall 412 operates to impede access to the cable 205 (i.e., the cable is located between the side wall 202b of the chassis 200 and the fan tray side wall 412.) Furthermore, one of skill in the art in possession of the present disclosure will recognize that a user may wish to route other cabling and/or position other components between the fan tray side wall 412 and the side wall 202b of the chassis 200. Further still, component(s) in the chassis 200 may be positioned adjacent the fan tray side wall 412 when the fan tray side wall 412 is in the first orientation such that access to those component(s) is impeded. For example, a motherboard positioned adjacent the fan tray system 400 may include a connector that is located adjacent the fan tray side wall 412 when the fan tray side wall 412 is in the first orientation such that access to that connector (e.g., the ability to connect a cable to that connector) is impeded. While a few examples directed to the fan tray side wall 412 have been provided, the fan tray side wall 414 may operate in a similar manner. Furthermore, one of skill in the art in possession of the present disclosure will recognize that when positioned in the first orientation, the fan tray side walls 412 and 414 may impede access to components in the chassis 200 in a variety of manners that will fall within the scope of the present disclosure.

The method 500 then proceeds to block 504 where a fan tray side wall is moved relative to the fan tray base from a first orientation to a second orientation. In an embodiment, at block 504, the fan tray side wall 412 may be rotated (e.g., using the handling element 412d), about the coupling of the rotatable coupling members 412c on the fan tray side wall 412 to the rotatable coupling features 416 on the fan tray base 402 and in the direction B from the first orientation illustrated in FIG. 4D to the second orientation illustrated in FIG. 4E. Similarly, at block 504, the fan tray side wall 414 may be rotated (e.g., using the handling element 414d) about the coupling of the rotatable coupling members 414c on the fan tray side wall 414 to the rotatable coupling features 418 on the fan tray base 402 and in the direction C from the first orientation illustrated in FIG. 4D to the second orientation illustrated in FIG. 4E. As discussed above, while the illustrated embodiments focus on rotational movement of the fan tray side walls 412 and 414, other types of moveable couplings and movement (e.g., translational movement) at block 504 will fall within the scope of the present disclosure as well.

The method 500 then proceeds to block 506 where at least one component in the chassis is accessed with the fan tray side wall in the second orientation. With reference to FIGS. 4E and 6B, one of skill in the art in possession of the present disclosure will recognize how, at block 506 and with the fan tray side walls 412 and/or 414 in the second orientation, a user may access components in the chassis 200 to which access was impeded when the fan tray side walls 412 and/or 414 were in the first orientation. For example, with the fan tray side wall 412 in the second orientation illustrated in FIG. 4E, at block 506 a user may access the cable 205 that runs along the side wall 202b of the chassis 200 (and that was previously located behind the fan tray side wall 412 in the first orientation.) Furthermore, with the fan tray side wall 412 in the second orientation illustrated in FIG. 4E, at block 506 a user may access a connector on a motherboard that is positioned adjacent the fan tray system 400 in order to connect a cable to that connector (an action that was previously impeded due to the positioned of the fan tray side wall 412 in the first orientation and immediately adjacent that connector.)

Furthermore, one of skill in the art in possession of the present disclosure will recognize how a user may position the fan tray side walls 412 and 414 in the second orientation similarly as above according to block 506 in order to position components adjacent (and/or extend components past) the portion of the chassis 200 that defines the fan tray system housing 204a. For example, a user may move the fan tray side wall 412 from the first orientation to the second orientation in order to route cables along the side wall 202b of the chassis 200 (e.g., cables that extend from a motherboard on a first side of the fan tray system 400 to a storage system located opposite the fan tray system 400 from the motherboard.) The routing of cables in this manner may be compared to conventional fan tray systems that provide a rigid channel adjacent the fan tray system through which cables must be forced for routing, and it will be appreciated by one of skill in the art in possession of the present disclosure that the movable fan tray side walls provide for much more intelligent cable routing and layering than those conventional fan tray systems, allowing a denser feature set via the chassis 200. For example, in one experimental embodiment, a conventional fan tray system in the chassis 200 only permitted the routing of cabling for 8 Peripheral Component Interconnect (PCI) Solid State Drives (SSDs) in the chassis 200, while the fan tray system 400 permitted the routing of cabling for 12 PCI SSDs in the chassis 200.

In another embodiment, a user may move the fan tray side wall 412 from the first orientation to the second orientation in order to position cards in the chassis 200 adjacent the fan tray system 400. For example, if a user wishes to provide a set of PCI SSD devices in the chassis 200, they may move the fan tray side wall(s) 412 and 414 as discussed above, connect cabling to a backplane connector and a PCI SSD riser, and install the PCI SSD riser in the chassis 200. In comparison, convention fan tray systems must be removed from the chassis in order to perform the same operation to install PCI SSD devices, greatly increasing the time it takes to install PCI SSD devices in the chassis 200. As such, it should be understood that movement of the fan tray side walls 412 and 414 into the second orientation may be performed in order to position components that will later be impeded by the fan tray side walls 412 and 414 in the first orientation, as well as to access components that are being impeded by the fan tray side walls 412 and 414 in the first orientation.

The method 500 then proceeds to block 508 where the fan tray side wall is moved relative to the fan tray base from the second orientation to the first orientation. With reference to FIGS. 4D, 4E, and 6B, at block 508 the fan tray side wall 412 may be rotated (e.g., using the handling element 412d) about the coupling of the rotatable coupling members 412c on the fan tray side wall 412 to the rotatable coupling features 416 on the fan tray base 402 and from the second orientation illustrated in FIG. 4E and back to the first orientation illustrated in FIG. 4D. Similarly, at block 508, the fan tray side wall 414 may be rotated (e.g., using the handling element 414d) about the coupling of the rotatable coupling members 414c on the fan tray side wall 414 to the rotatable coupling features 418 on the fan tray base 402 and from the second orientation illustrated in FIG. 4E back to the first orientation illustrated in FIG. 4D. In an embodiment, rotation of the fan tray side walls 412 and 414 into the first orientation results in the securing element 412e on the fan tray securing subsystem of the fan tray side wall 412 engaging the fan tray securing feature 206 on the side wall 202b of the chassis 202, and results in the securing element 414e on the fan tray securing subsystem of the fan tray side wall 414 engaging a similar fan tray securing feature on the side wall 202c of the chassis 202, in order to secure the fan tray side walls 412 and 414 to the chassis 200. With the fan tray side walls 412 and 414 secured to the chassis 200, the fan tray system 400 is secured to the chassis 200 (e.g., the securing element 412e and 414e must be deactivated to release them from the fan tray securing features on the chassis 200 in order to move the fan tray side walls 412 and 414 out of the first orientation, and/or remove the fan tray system 400 from the chassis 200.)

Furthermore, rotation of the fan tray side walls 412 and 414 into the first orientation results in the air directing member 412h on the fan tray side wall 412 engaging the side wall 202b of the chassis 200, and results in the air directing member 414h on the fan tray side wall 414 engaging the side wall 202c of the chassis 200. While not illustrated, one of skill in the art in possession of the present disclosure will recognize that cabling in the chassis 200 may be routed through the any of the cabling apertures 403 and/or cable routing members 410 in order to extend that cabling through the fan tray system 400 as desired. The cable aperture plugs 403a discussed above may then be positioned in any cable aperture 403 that is not used to route cabling in such a manner.

With the fan tray system 400 secured in the chassis 200 as illustrated in FIG. 6B, the fan system 300 may then be coupled to the fan tray system 400. For example, while FIG. 6A illustrates an exploded view of the fan system 300, one of skill in the art in possession of the present disclosure will recognize that the fan devices 304a and 304e may be positioned in the fan device housing 302a on the fan device chassis 302, the fan devices 304b and 304f may be positioned in the fan device housing 302b on the fan device chassis 302, the fan devices 304c and 304g may be positioned in the fan device housing 302c on the fan device chassis 302, and the fan devices 304d and 304h may be positioned in the fan device housing 302d on the fan device chassis 302. With the fan devices 302a-h positioned in the fan device chassis 302, the fan system 300 may be moved in the direction D into the fan tray system 400 (that is secured in the chassis 200 as discussed above.) Movement of the fan system 300 into the fan tray chassis 400 causes the fan chassis 300 to engage the fan system guides 412b on the fan tray side wall 412 and the fan system guides 414b on the fan tray side wall 414, which then operate to guide the fan system 300 (during its continued movement in the direction D) into the fan tray system 400 until the connectors on the fan devices 302a-h engage respective connectors 404 in the fan tray system 400 in order to couple the fan devices 302a-h to the system via the system connectors 406 (which, as discussed above, may be connected to a component in the chassis 200 such as a motherboard.) While not explicitly illustrated, the securing handles 303 on the fan system 300 may be used (e.g., in an unillustrated orientation in which they are perpendicular to the fan device chassis 302) to hold and move the fan system 300 as discussed above, and then utilized (e.g., by rotating them to the orientation illustrated in FIG. 3) to secure the fan system 300 in the fan tray system 400 (e.g., via engagement of the cam elements 303a with the fan tray system 400.)

With the fan system 300 secured in the fan tray system 400, and the fan tray system 400 secured in the chassis 200, the fan devices 302a-h in the fan system 300 may operate to move air through the chassis 200. In response to the movement of the air through the chassis using the fan devices 302a-h in the fan system 300, the air directing members 412h and 414h may operate to direct the airflow in the housing 204 of the chassis 200. For example, the engagement of the air directing members 412h and 414h with the side walls 202b and 202c of the chassis 202, respectively, operates to block airflow between the fan tray side wall 412 and the side wall 202b and between the fan tray side wall 414 and the side wall 202c, respectively, and direct air through the fan devices 302a-h. Furthermore, the cable aperture plugs 403a located in the cable apertures 403 may operate in a similar manner to direct the airflow in the housing 204 of the chassis 200 via the blocking of airflow through cable apertures that are not being used to route cables. Furthermore, in some embodiments, the fan tray system 400 may engage components in the chassis to secure the positioning of those components. For example, the fan tray system 400 may engage a motherboard in the chassis 200 to prevent motherboard movement during shock and vibration events.

Thus, systems and methods have been described that provide a fan tray system that is configured to couple to a chassis without the use of a tool, along with fan tray side walls that may be moved relative to the chassis from a first orientation and a second orientation to allow access to portions of, or components in, the chassis that may be impeded when the fan tray side walls are in the first orientation. The tray side walls allow for the simplified routing of cables between the fan tray side walls and the side walls of the chassis, servicing access to cables that are positioned between the fan tray side walls and the side walls of the chassis, and connector access to connectors that are located adjacent the fan tray side walls when those fan tray side walls are in the first orientation. As such, the fan tray system described herein introduces improvements over conventional fan tray systems known in the art by providing for tool-less installation and removal of the fan tray system, minimizing the steps needed to access components in the chassis, and routing cables within the chassis without impacting airflow while also allowing access to those cables once they are routed.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A fan tray system, comprising:
a fan tray base that is configured to couple to a chassis;
at least one fan device connector that is mounted to the fan tray base via a connector mount that allows the at least one fan device connector to extend from the fan tray base, wherein the at least one fan device connector is configured to connect to each respective at least one fan device that is included in a fan system;
a fan tray side wall including at least one fan system guide member that is configured to align the fan system for connection with each of the respective at least one fan device to the at least one fan device connector; and
a moveable coupling connecting the fan tray side wall to the fan tray base, wherein the moveable coupling is configured to allow relative movement between the fan tray side wall and the fan tray base such that:
the fan tray side wall may be positioned in a first orientation when the fan tray base is coupled to the chassis such that the fan tray side wall is positioned adjacent a chassis wall of the chassis and impedes access to at least one component in the chassis that requires access when the fan tray side wall is positioned adjacent the chassis wall; and
the fan tray side wall may be moved to a second orientation that is different than the first orientation and that allows access to the at least one component in the chassis.

2. The system of claim 1, further comprising:
at least one airflow directing member that is coupled to the fan tray side wall, wherein the at least one airflow directing member is configured to engage the chassis wall when the fan tray side wall is positioned in the first orientation in order to direct airflow.

3. The system of claim 1, further comprising:
a plurality of cabling apertures that are defined by the fan tray base, wherein a cabling aperture plug is positioned in at least one of the plurality of cabling apertures.

4. The system of claim 1, further comprising:
a fan tray securing subsystem that is located on the fan tray side wall, wherein the fan tray securing subsystem is configured to is configured to engage the chassis wall when the fan tray side wall is positioned in the first orientation in order to secure the fan tray base in the chassis.

5. The system of claim 1, further comprising:
at least one computing system connector that is coupled to the at least one fan device connector, wherein the at least one computing system connector is configured to connect to a system component that is located in the chassis when the fan tray base is coupled to the chassis.

6. The system of claim 1, wherein the fan tray side wall is a first fan tray side wall that is connected to a first side of the fan tray base by a first moveable coupling that allows for positioning of the first fan tray side wall adjacent a first chassis wall of the chassis to impede access to at least one first component in the chassis, as well as movement of the first fan tray side wall to allow access to the at least one first component in the chassis, and wherein the system further comprises:

a second fan tray side wall that includes at least one fan system guide member that is configured to align the fan system for connection to the at least one fan device connector; and
a second moveable coupling connecting the second fan tray side wall to a second side of the fan tray base that is opposite the fan tray base from the first side, wherein the second moveable coupling is configured to allow relative movement between the second fan tray side wall and the fan tray base such that:
the second fan tray side wall may be positioned in a first orientation when the fan tray base is coupled to the chassis such that the second fan tray side wall is positioned adjacent a second chassis wall of the chassis and impedes access to at least one second component in the chassis; and
the second fan tray side wall may be moved to a second orientation that is different than the first orientation and that allows access to the at least one second component in the chassis.

7. An Information Handling System (IHS), comprising:
a chassis that includes a chassis wall;
a cable routed immediately adjacent the chassis wall;
a fan tray base that is coupled to the chassis;
at least one fan device connector that is mounted to the fan tray base via a connector mount that allows the at least one fan device connector to extend from the fan tray base, wherein the at least one fan device connector is configured to connect to each respective at least one fan device that is included in a fan system;
a fan tray side wall including at least one fan system guide member that is configured to align the fan system for connection with each of the respective at least one fan device to the at least one fan device connector; and
a moveable coupling connecting the fan tray side wall to the fan tray base, wherein the moveable coupling is configured to allow relative movement between the fan tray side wall and the fan tray base such that:
the fan tray side wall may be positioned in a first orientation such that the fan tray side wall is positioned adjacent the chassis wall and impedes access to the cable; and
the fan tray side wall may be moved to a second orientation that is different than the first orientation and that allows access to the cable.

8. The IHS of claim 7, further comprising:
at least one airflow directing member that is coupled to the fan tray side wall and that engages the chassis wall when the fan tray side wall is positioned in the first orientation in order to direct airflow.

9. The IHS of claim 7, further comprising:
a plurality of cabling apertures that are defined by the fan tray base, wherein a cable is located in at least one of the plurality of cabling apertures, and wherein a cabling aperture plug is positioned in at least one of the plurality of cabling apertures.

10. The IHS of claim 7, further comprising:
a keying subsystem included in the chassis; and
at least one keying element provided on the fan tray base, wherein the at least one keying element engages the keying subsystem to orient the fan tray base in the chassis.

11. The IHS of claim 7, further comprising:
a fan tray securing subsystem that is located on the fan tray side wall and that engages the chassis wall when the fan tray side wall is positioned in the first orientation to secure the fan tray base in the chassis.

12. The IHS of claim 7, further comprising:
at least one computing system connector that is coupled to the at least one fan device connector, wherein the at least one computing system connector is connected to a system component that is located in the chassis when the fan tray base is coupled to the chassis.

13. The IHS of claim 7, wherein the fan tray side wall is a first fan tray side wall that is connected to a first side of the fan tray base by a first moveable coupling that allows for positioning of the first fan tray side wall adjacent a first chassis wall of the chassis to impede access to the cable, as well as movement of the first fan tray side wall to allow access to the cable, and wherein the IHS further comprises:
a second fan tray side wall that includes at least one fan system guide member that is configured to align the fan system for connection to the at least one fan device connector; and
a second moveable coupling connecting the second fan tray side wall to a second side of the fan tray base that is opposite the fan tray base from the first side, wherein the second moveable coupling is configured to allow relative movement between the second fan tray side wall and the fan tray base such that:
the second fan tray side wall may be positioned in a first orientation such that the second fan tray side wall is positioned adjacent the second chassis wall and impedes access to at least one component in the chassis; and
the second fan tray side wall may be moved to a second orientation that is different than the first orientation and that allows access to the at least one component in the chassis.

14. A method for providing a fan tray system in a chassis, comprising:
providing a fan tray base that is coupled to a chassis and that includes at least one fan system connector that is mounted to the fan tray base via a connector mount that allows the at least one fan system connector to extend from the fan tray base wherein the at least one fan system connector is configured to connect to a fan system including at least one fan device;
moving, relative the fan tray base and from a first orientation to a second orientation using a moveable coupling to the fan tray base, a fan tray side wall that includes at least one fan system guide member that is configured to align the fan system for connection to the at least one fan system connector, wherein the first orientation of the fan tray side wall provides the fan tray side wall adjacent a chassis wall of the chassis such that the fan tray side wall impedes access to at least one component in the chassis that requires access when the fan tray side wall is positioned adjacent the chassis wall, and wherein the second orientation of the fan tray side wall allows access to the at least one component in the chassis;
accessing the at least one component; and
moving, the fan tray side wall relative to the fan tray base and from the second orientation to the first orientation subsequent to accessing the at least one component.

15. The method of claim 14, further comprising:
engaging at least one airflow directing member that is coupled to the fan tray side wall with the chassis wall; and
directing airflow using the at least one airflow directing member engaging the chassis wall.

16. The method of claim 14, further comprising:
positioning, in at least one of a plurality of cabling apertures that are defined by the fan tray base, a cable; and
positioning, in at least one of the plurality of cabling apertures that are defined by the fan tray base, a cabling aperture plug.

17. The method of claim 14, further comprising:
engaging, by at least one keying element provided on the fan tray base, a keying subsystem included in the chassis to orient the fan tray base in the chassis.

18. The method of claim 14, further comprising:
engaging, by a fan tray securing subsystem that is located on the fan tray side wall, the chassis wall when the fan tray side wall is positioned in the first orientation in order to secure the fan tray base in the chassis.

19. The method of claim 14, further comprising:
connecting, to a system component that is located in the chassis, at least one computing system connector that is coupled to the at least one fan system connector.

20. The method of claim 14, where the fan tray side wall is a first fan tray side wall that is connected to a first side of the fan tray base by a first moveable coupling that allows for positioning of the first fan tray side wall adjacent a first chassis wall of the chassis to impede access to at least one first component in the chassis, as well as movement of the first fan tray side wall to allow access to the at least one first component in the chassis, and wherein the method further comprises:
moving, relative the fan tray base and from a first orientation to a second orientation using a second moveable coupling to the fan tray base, a second fan tray side wall that includes at least one fan system guide member that is configured to align the fan system for connection to the at least one fan system connector, wherein the first orientation of the second fan tray side wall provides the second fan tray side wall adjacent a second chassis wall of the chassis such that the second fan tray side wall impedes access to at least one second component in the chassis, and wherein the second orientation of the second fan tray side wall allows access to the at least one second component in the chassis;
accessing the at least one second component; and
moving, relative the fan tray base and from the second orientation to the first second orientation subsequent to accessing the at least one component, the second fan tray side wall.

* * * * *